United States Patent
Aytug et al.

(10) Patent No.: US 8,647,915 B2
(45) Date of Patent: Feb. 11, 2014

(54) HETERO-JUNCTION PHOTOVOLTAIC DEVICE AND METHOD OF FABRICATING THE DEVICE

(75) Inventors: Tolga Aytug, Knoxville, TN (US); David K. Christen, Oak Ridge, TN (US); Mariappan Parans Paranthaman, Knoxville, TN (US); Özgur Polat, Knoxville, TN (US)

(73) Assignees: UT-Battelle, LLC, Oak Ridge, TN (US); University of Tennessee Research Foundation, Knoxville, TN (US)

(*) Notice: Subject to any disclaimer, the term of this patent is extended or adjusted under 35 U.S.C. 154(b) by 513 days.

(21) Appl. No.: 12/974,425

(22) Filed: Dec. 21, 2010

(65) Prior Publication Data

US 2012/0152337 A1  Jun. 21, 2012

(51) Int. Cl.
*H01L 31/0352* (2006.01)
*H01L 31/18* (2006.01)

(52) U.S. Cl.
USPC ......... 438/85; 257/E31.032; 136/255; 117/84

(58) Field of Classification Search
USPC ......... 438/85; 257/E31.032; 136/255; 117/84
See application file for complete search history.

(56) References Cited

U.S. PATENT DOCUMENTS

| | | | |
|---|---|---|---|
| 4,795,501 | A | 1/1989 | Stanbery |
| 5,935,345 | A | 8/1999 | Kuznicki |
| 7,019,339 | B2 | 3/2006 | Atwater, Jr. et al. |
| 7,335,908 | B2 | 2/2008 | Samuelson et al. |
| 7,754,964 | B2 | 7/2010 | Kempa et al. |
| 2006/0021564 | A1* | 2/2006 | Norman et al. ............ 117/84 |
| 2009/0165859 | A1 | 7/2009 | Forrest et al. |
| 2010/0147381 | A1 | 6/2010 | Haney et al. |

FOREIGN PATENT DOCUMENTS

| | | |
|---|---|---|
| JP | 2001085725 A | 3/2001 |
| JP | 2003273373 A | 3/2002 |
| WO | WO 2010/062644 A2 | 6/2010 |

OTHER PUBLICATIONS

Griggs et al., *"P-n Junction Heterostructure Device Physics Model of a Four Junction Solar Cell"*-Proc. Of SPIE vol. 6339 63390D-1, (8 pgs).

Hsueh et al., *"$Cu_2O/n$-ZnO Nanowire Solar Cells on ZnO:Ga/glass Templates"*—Science Direct—(2007), pp. 53-56.

(Continued)

*Primary Examiner* — Matthew W Such
*Assistant Examiner* — Robert Carpenter
(74) *Attorney, Agent, or Firm* — Brinks Hofer Gilson & Lione

(57) ABSTRACT

A hetero-junction device and fabrication method in which phase-separated n-type and p-type semiconductor pillars define vertically-oriented p-n junctions extending above a substrate. Semiconductor materials are selected for the p-type and n-type pillars that are thermodynamically stable and substantially insoluble in one another. An epitaxial deposition process is employed to form the pillars on a nucleation layer and the mutual insolubility drives phase separation of the materials. During the epitaxial deposition process, the orientation is such that the nucleation layer initiates propagation of vertical columns resulting in a substantially ordered, three-dimensional structure throughout the deposited material. An oxidation state of at least a portion of one of the p-type or the n-type semiconductor materials is altered relative to the other, such that the band-gap energy of the semiconductor materials differ with respect to stoichiometric compositions and the device preferentially absorbs particular selected bands of radiation.

26 Claims, 3 Drawing Sheets

(56) References Cited

OTHER PUBLICATIONS

Lin et al., *"Optical Absorption Enhancement in Silicon Nanowire Arrays with a Large Lattice Constant for Photovoltaic Applications"*—Oct. 26, 2009 / vol. 17, No. 22 / Optics Express 19371, (11 pgs).

Tang et al., *"Vertically Aligned p-Type Single-Crystalline GaN Nanorod Arrays on n-Type Si for Heterojunction Photovoltaic Cells"*—2008 American Chemical Society —Published on Wed Oct. 29, 2008, pp. 4191-4195.

Wei et al., *"Direct Heteroepitaxy of Vertical InAs Nanowires on Si Substrates for Broad Band Photovoltaics and Photodetection"*—2009 American Chemical Society, pp. 2926-2934).

Zhang et al., *"Quantum Coaxial Cables" for Solar Energy Harvesting*—2007 American Chemical Society, pp. 1264-1269.

\* cited by examiner

HETERO-JUNCTION PHOTOVOLTAIC DEVICE AND METHOD OF FABRICATING THE DEVICE

This invention was made with government support under Contract No. DE-ACO5-000R22725 awarded by the U.S. Department of Energy. The government has certain rights in the invention.

TECHNICAL FIELD

The invention relates, in general, to hetero-junction devices and to methods for their fabrication and, more particularly, to hetero-junction photovoltaic devices that include vertically arranged n-type and p-type semiconductor materials.

BACKGROUND

In recent years, activity in solar cell research has increased considerably. This research is driven by the need for solar-to-electricity conversion devices having increased efficiency. To meet the demand for increased efficiency, a small but rapidly growing segment of photovoltaic technology research has focused on so-called second generation solar cells. These devices include thin films fabricated with materials such as $Cu(In_xGa_{1-x})Se_2$ (CIGS) and CdTe, and the like. Thin-film-based photovoltaic technologies offer potential long-term high-efficiency, and represent an economically-viable alternative for large-scale solar energy conversion and power generation. These technologies provide better solar energy conversion at lower cost than established silicon (Si) technologies, but their efficiency needs to be enhanced for making them practically viable.

The development of thin-film based solar conversion devices has been hampered by low film quality, complex manufacturing processes, and low scale-up yield. In an effort to address these problems, third generation photovoltaic devices, including multi-junction cells, dye sensitized solar cells, bulk hetero-junction devices, and organic cells, including tandem cells, have been developed to combine the advantages of both the first and second generation devices. These devices, however, exhibit either high manufacturing costs, or poor conversion efficiency, usually of less than about 10%, or poor durability and photo stability.

One of the central issues leading to low conversion efficiency in conventional planar p-n junction devices and, in particular, thin-film hetero-junction devices, relates to a limited minority carrier diffusion length as compared to the thickness of the absorber film. This problem results in the inevitable charge recombination due to the existence of a large concentration of defects, such as dislocations, vacancies, and impurities.

In an effort to improve the charge collection efficiency and for further cost reductions, nano-structured materials, such as nanorods, nanowires, and nanotubes have been explored as components for photovoltaic devices. Compared to thin films, nano-scale materials enable substantial light absorption due to a large surface area and good light trapping properties. Devices employing nano-structured materials also benefit from short range, efficient spatial carrier separation, which alleviates one of the key problems of the various forms of planar device architectures. In effect, a semiconductor device consisting of nano-structures arranged in vertically-aligned arrays of radial p-n junctions can more effectively suppress the non-radiative, bulk recombination events and, hence, may relax the stringent requirements on material quality. Despite their high efficiency potential, however, to date fabricated photovoltaic solar cells based on such nano-structured assemblies yield conversion efficiencies of only about 0.5 to 3%. This is far below the computer simulated, theoretical efficiency limits of around 11%.

The low conversion efficiency of these vertically-aligned, p-n junction devices is typically caused by non-optimized dimensions, low cell density, poor cell alignment, or lack of proper ordering of the nano-structures. Further problems relate to low p-n junction interface quality. Furthermore, the fabrication of these nanostructures generally requires use of complicated fabrication techniques or multiple-step processing schemes that are unsuitable for large-scale manufacturing. To date, controlled and cost-effective fabrication of large-area, nano-structured assemblies for photovoltaic devices have yet to be demonstrated.

SUMMARY

In one embodiment, a method of fabricating a hetero-junction device includes forming a nucleating sight on a substrate. Epitaxial pillars of n-type material and p-n junction therebetween. The oxidation state of at least one of the n-type material and p-type material is adjusted. An electrode layer is formed contacting the adjacent pillars.

In another embodiment, a method of forming a hetero-junction photovoltaic device includes providing a substrate and forming a nucleating layer on the substrate. Phase-separated, substantially insoluble n-type and p-type pillars are selectively formed on the nucleating layer. The pillars have vertically-aligned radial p-n junctions. Further, the n-type and p-type pillars comprise semiconductor materials having band-gap energies to preferentially absorb a designated region of the solar spectrum. Accordingly, an energy absorption characteristic of the device is substantially similar to the solar spectrum. One of the n-type and p-type epitaxial pillars is selectively oxidized to alter the band-gap energy relative to the other pillar. An electrode layer is formed that contacts the n-type and p-type epitaxial pillars.

In yet another embodiment, a photovoltaic device includes an insulating substrate and an electrode layer overlying the substrate. Phase-separated, substantially insoluble n-type and p-type pillars reside on the substrate and define vertically-aligned radial p-n junctions. The n-type and p-type pillars include semiconductor materials having band-gap energies, such that one of the p-type or the n-type pillars preferentially absorbs visible radiation and the other preferentially absorbs UV radiation. An oxidation state of at least a portion of one of the p-type pillars or the n-type pillars are altered relative to the other pillars, such that the band-gap energy differs with respect to a stoichiometric composition. An electrode layer contacts the n-type and p-type epitaxial pillars.

DETAILED DESCRIPTION

Figure 1:
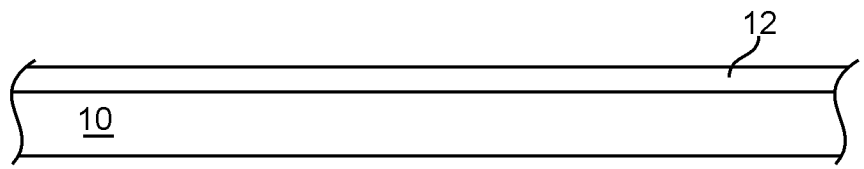
FIGS. 1-3 illustrate, in cross-section, process steps in accordance with an embodiment of the invention.

In accordance with an aspect of the invention, a hetero-junction device and fabrication method are provided in which phase-separated n-type and p-type pillars are produced on a substrate. The n-type and p-type pillars define vertically-oriented p-n junctions extending above the substrate. In one embodiment, an epitaxial deposition process is employed to form the pillars on a nucleation layer. Preferably, semiconductor materials are selected for the p-type and n-type pillars that are thermodynamically stable and substantially insoluble in one another. The insolubility drives the phase separation, such that elastic strain and interfacial energies are minimized during the epitaxial growth process. During the epitaxial process, the orientation is such that the nucleation layer initiates propagation of vertical columns resulting in an ordered three-dimensional structure throughout the deposited material.

The hetero-junction structure formed in accordance with the invention can be used in a wide variety of devices, including superconductors, photonics, magnetic data storage, energy storage, sensors, photovoltaic devices, photocatalysis devices, batteries, and the like. In a particularly preferred embodiment, the hetero-junction device is fabricated to form a photovoltaic device.

In accordance with various aspects of the inventive photovoltaic device, the energy absorption profile is adjusted to capture a significant fraction of the solar spectrum. Further, the particular epitaxial deposition process employed to fabricate the device provides low defect density and improved charge carrier separation. Further, energy collection efficiency is improved through the creation of the vertically-aligned p-injunctions. Also, enhanced light-harvesting capability is realized as a result of the high-aspect ratio interfaces between the n-type and p-type pillars. Significantly, the energy absorption characteristics of the hetero-junction device are substantially enhanced through the selective oxidation of one of the n-type or p-type materials used to fabricate the pillars. By selectively oxidizing the material of one of the pillars, the energy absorption characteristics of the affected pillar is altered relative to the remaining pillar. Accordingly, the energy absorption characteristics of the device can be precisely adjusted through the chemical modification of the fabrication materials.

Those skilled in the art will appreciate that a wide variety of semiconductor materials can be epitaxially formed on a nucleation layer. Further, a wide variety of semiconductor materials are susceptible to a change in their oxidation state through straight-forward chemical oxidation processes. In accordance with an aspect of the invention, a number of semiconductor materials can be included in various combinations. These materials include $TiO_2$, $CuO$, $Cu_2O$, n-type $ZnO$, n-type $SnO_2$, n-type $Bi_2O_3$, $ZnMn_2O_4$, $LaMnO_3$, $SrTiO_3$, $BiFeO_3$, $NiO$, $LaTiO_3$, $Ba_2RENbO_6$ (RE=Y or other Rare Earth), $Ba_2RETaO_6$ (RE=Y or other Rare Earth), $Fe_2O_3$, $WO_3$, n-type CdS, n-type CdSe, p-type CdTe, n-type InP, CIG, p-type CIGS, Si, Ge, n-type GaN, p-type GaN and TiN, and the like. These semiconductor materials can be doped to have n-type or p-type conductivity as indicated and can be included in various appropriate combinations to construct a hetero-junction device in accordance with the invention. Further, a variety of substrate materials can be used to provide substrates upon which to form the epitaxial pillars. For example, single crystal $LaAlO_3$ and other aluminum oxide and other single crystal oxide substrates can be used.

In a preferred embodiment, chemically phase-separated p-type $TiO_2$ and n-type $Cu_2O$ structures are formed on a nucleation layer by RF magnetron sputtering. The titanium dioxide and copper II oxide materials have high chemical stability, good photo stability, and are relatively environmentally friendly. Further, n-type $TiO_2$ has a band-gap energy of about 3.2 eV, and p-type $Cu_2O$ has a band-gap energy of about 2.0 eV. Accordingly, a photovoltaic device can be fabricated having a photo-response that extends from the ultraviolet to the visible region of the solar spectrum. In one particular embodiment of a photovoltaic device, the $TiO_2$ component preferentially absorbs radiation in the ultraviolet range, while the $Cu_2O$ component preferentially absorbs radiation visible range.

In accordance with a particular feature of the invention, the oxidation state of the $Cu_2O$ (copper I oxide) can be changed to CuO (copper II oxide). In comparison with $Cu_2O$, CuO has a band-gap energy of about 1.3 eV. By narrowing the band-gap energy of copper I oxide, the energy absorption characteristics of the device can be finally-tuned to substantially match the solar spectrum.

In one embodiment, copper I oxide can be changed to copper II oxide by annealing this material in an oxidizing ambient at appropriate temperature and pressure conditions. Notably, the annealing process can be carried out to oxidize copper I oxide to copper II oxide, while the $TiO_2$ remains unaffected by the oxidation process. Accordingly, the phase fractions of copper I oxide and copper I oxide can be altered within a thin film matrix so as to provide varying band-gap energies of about 3.2 eV to about 1.3 eV within the matrix.

A further notable feature of the $Cu_2O$—$TiO_2$ system relates to the energy band interface between these two materials. In particular, the conduction band minimum and the valence band maximum of the copper I oxide/copper II oxide complex, are greater than the corresponding energy levels of $TiO_2$. Thus, the interfacial band-gap energies of the preferred materials provide highly efficient charge transfer during energy absorption.

Figure 2:
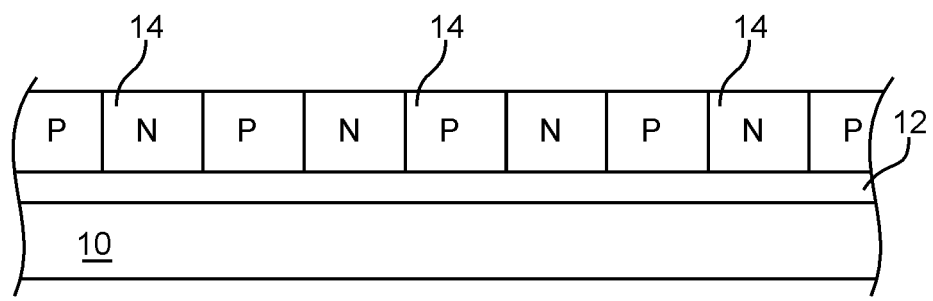

A fabrication process in accordance with one embodiment is illustrated in FIGS. 1 and 2. A substrate 10 is provided and a nucleation layer 12 is formed thereon. Substrate 10 can be one of a number of different substrate materials depending upon the particular application of the fabricated device. In one embodiment, substrate 10 is lanthanum aluminum oxide ($LaAlO_3$). Substrate 10 is preferably a single crystal substrate having a [001] crystalline orientation. Additionally other single crystal materials can be used including silicon, gallium arsenide, and the like.

Nucleating layer 12 is formed from a material that will provide a nucleation site upon which epitaxial semiconductor pillars can be formed. In the preferred embodiment in which $TiO_2$ and $Cu_2O$ semiconductor materials are used to form the pillars, nucleating layer 12 can be either $TiO_2$ or $Cu_2O$. As will subsequently be described, in one embodiment, a selective oxidation process is carried out to alter the oxidation state of the $Cu_2O$. In the case where the $Cu_2O$ is selectively oxidized, nucleating layer 12 is preferably $TiO_2$. Preferably, the titanium dioxide layer is formed by sputter deposition followed by in-situ post-annealing. The sputter deposition process is preferably carried out at a pressure of about 5.0 to about $6.0 \times 10^{-3}$ Torr and a temperature of about 700° C. In one embodiment, the sputter deposition process is carried out in an argon atmosphere at a sputtering power of about 80 Watts. The titanium dioxide layer can be formed to a variety of thicknesses. In one preferred embodiment, the titanium dioxide film is formed to a thickness of about 100 nanometers in roughly 45 minutes. Those skilled in the art will appreciate that the particular process parameters are representative and could change depending upon a variety of factors, such as the particular type of device undergoing fabrication, the deposition system, the operating environment, and the like. Following completion of the sputter deposition process, the substrate is annealed in-situ at a temperature of about 400° C. to about 600° C. for about 30 to about 100 to 150 minutes. In one embodiment, the annealing is carried out under an argon atmosphere and an annealing pressure of about 5.0 to about $6.0 \times 10^{-3}$ Torr. Following annealing, the substrate is cooled over approximately a two hour period during which the temperature drops to room temperature, while maintaining the deposition chamber at a reduced pressure of no more than about $2 \times 10^{-5}$ Torr.

Those skilled in the art will appreciate that various processes can be employed to form nucleation layer 12. For example, chemical-vapor-deposition (CVD) and plasma-enhanced-CVD processes can be used to form a nucleation layer. Further, different types of physical-vapor-deposition (PVD) processes can be used, such as e-beam of evaporation, pulse laser deposition, and the like. Further, the foregoing sputtering conditions are only representative, and those skilled in the art will appreciate that, depending upon the particular substrate and the particular device characteristics sought, different sputtering conditions can be employed.

Figure 5:
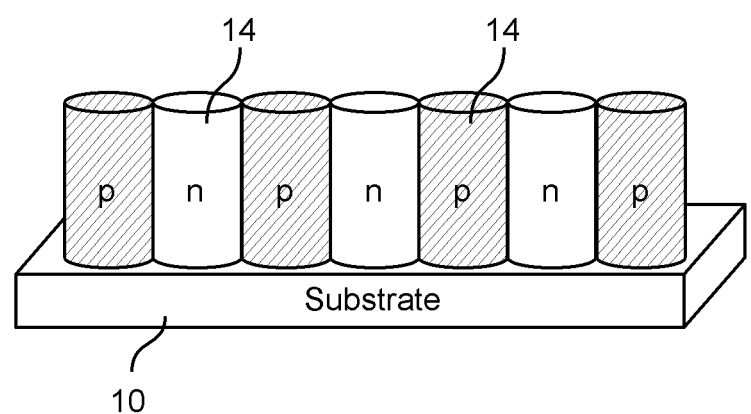

Once nucleating layer 12 is formed, p-type and n-type pillars are epitaxially grown on nucleating layer 12. As illustrated in FIG. 2, alternating p-type and n-type pillars are formed adjacent to one another having vertically-aligned p-n junctions 14. As schematically illustrated in FIG. 5, the p-n junctions at the interface of the p-type and n-type pillars 14 are radially oriented with respect to the center of each epitaxial pillar.

In accordance with a preferred embodiment, the p-type and n-type pillars are formed by an RF sputtering process. In one particular sputtering process, the sputtering system is equipped with a composite target of stoichiometric $TiO_2$: $Cu_2O$ powder. The stoichiometric powder mixture is commercially available in powder form from a variety of chemical manufacturers. In one embodiment, an RF sputtering process is carried out with a composite target having about a 50/50 ratio of $TiO_2$ and $Cu_2O$. The sputter deposition process is carried out in an inert atmosphere that can optionally include oxygen. For example, the RF deposition process can be carried out in an argon atmosphere or in a mixture of argon and oxygen. Preferably, the sputtering process is carried out at a temperature of about 700° C. and at a pressure of about $5.0 \times 10^{-3}$ Torr. An RF power of about 80 watts is applied and the deposition processes carried out for about 45 minutes to about 1.5 hours. Under these sputtering conditions, a film matrix having a thickness of about 50 to about 500_nanometers is deposited on nucleation layer 10.

During the sputtering process, successive layers of phase-separated titanium dioxide and copper II oxide are formed, such that pillar-type structures extend vertical upward from the surface of nucleation layer 12. Once the sputter deposition process is complete, an optional annealing process can be carried out at a temperature of about 700° C. to about 850° C. under an argon atmosphere. The post-annealing process functions to improve the phase separation of the semiconductor materials. The post-annealing process is preferably carried out for about 30 minutes. Afterward, the substrate is cooled to room temperature while maintaining a positive pressure of argon in the annealing chamber.

Once the epitaxial pillars are formed, an oxidation process is carried out to convert at least a portion of the copper I oxide to copper II oxide. The oxidation process can be carried out in a number of different processes. For example, an annealing process can be performed under an oxygen atmosphere for a period of time sufficient to oxidize the copper I oxide to copper II oxide. The conditions are selected, such that only the copper I oxide reacts with oxygen and the $TiO_2$ pillars are substantially unaffected by the oxidation process. Alternatively, other means of at least partially oxidizing the copper I oxide can be employed. For example, the oxidation can take place during the deposition process by, for example, introducing an excess of oxygen during the RF sputtering process.

Those skilled in the art will appreciate that various types of epitaxial processes and deposition processes can be employed to form the pillars. For example, processes such as laser deposition, e-beam evaporation, metal organic CVD (MOCVD), and the like can be used.

Figure 3:
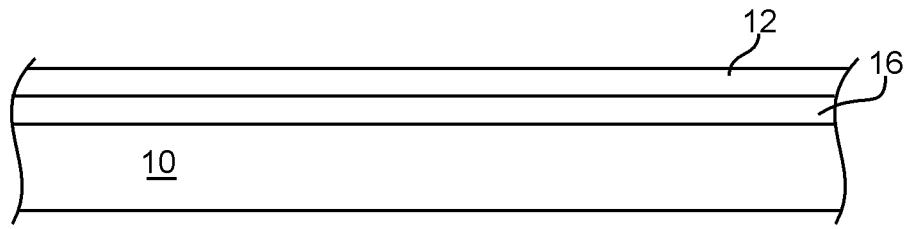

In an alternative embodiment, as illustrated in FIG. 3, an electrode layer 16 is formed on substrate 10 prior to forming nucleation layer 12. In one embodiment, electrode layer 16 comprises an electrically conductive material, such as lanthanum nickel oxide ($LaNiO_3$). Other electrically conductive materials could also be formed on the substrate, such as Mo, Cu, lanthanum strontium manganese oxide (LSMO), lanthanum strontium titanium oxide (LSTO), and the like. Electrode layer 16 provides an electrical contact layer to the underside of the n-type and p-type semiconductor pillars. Alternatively, or in addition to electrode layer 16, an electrode layer can be formed overlying the n-type and p-type semiconductor pillars. Those skilled in the art will appreciate that a variety of finishing processes can be carried out to complete the fabrication of a hetero-junction device, such as a photovoltaic device, including formation of insulating layers, optical focusing layers, packaging layers, and the like.

Figure 4:
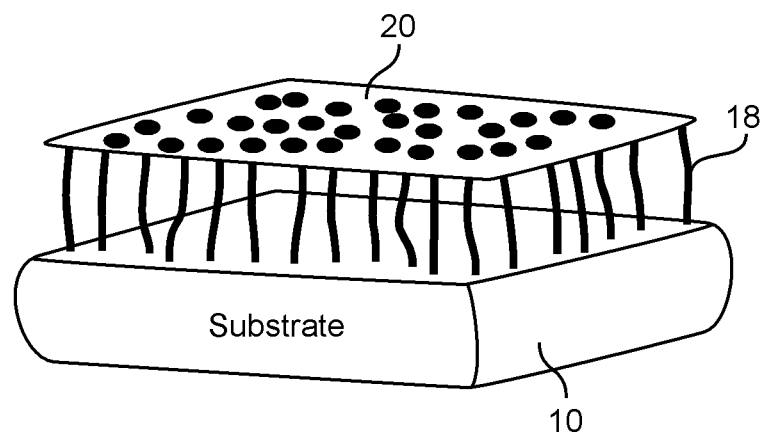
FIGS. 4 and 5 are schematic drawings illustrating perspective views of a substrate having epitaxial pillars formed in accordance with an embodiment of the invention.

FIGS. 4 and 5 schematically illustrate perspective views of substrate 10 having the p-type and n-type semiconductor pillars thereon. FIG. 4 is a conceptual illustration of the hetero-junction device in which pillars 18 extend upward from the surface of substrate 10. The pillars extend upward through matrix material 20. Pillars 18 represent phase-separated p-type or n-type material in an epitaxial matrix of n-type or p-type material 20. The schematic illustration of FIG. 4 is intended to show that the inventive structure can include portions that are not phase-separated, but rather exist in a polycrystalline or amorphous state on the surface of substrate 10. Accordingly, the invention allows for incomplete phase separation of the sputter-deposited material. Those skilled the art will appreciate that energy conversion functionality can be achieved even in the absence of complete phase separation of the semiconductor materials deposited during the fabrication process.

FIG. 5 schematically illustrates a somewhat rounded geometry of the n-type and p-type pillars. The schematic illustration of FIG. 5 is in keeping with the general rounded geometry of composite as observed by atomic force microscopy of samples prepared in accordance with the process described herein. In actual samples, the n-type p-type pillars can have a somewhat square- and rectangular-like geometry, as opposed to a perfectly circular geometry.

Figure 6:
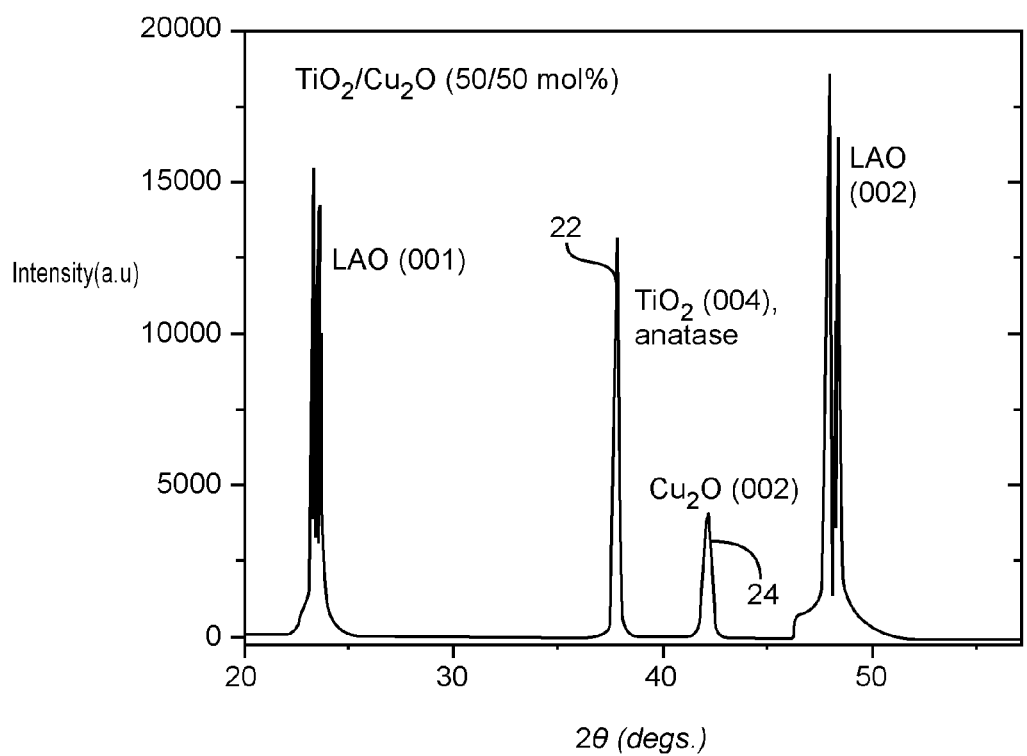
FIG. 6 is a plot of an XRD spectrogram illustrating the phase separation of epitaxially-grown $TiO_2:Cu_2O$ pillars on a lanthanum aluminum oxide substrate ($LaAlO_3$).

An x-ray diffraction pattern of a $TiO_2$—$Cu_2O$ matrix is illustrated in FIG. 6. As noted in the spectrogram, the distinct separate peaks for $TiO_2$ and $Cu_2O$ clearly show the substantial phase separation obtained in the analyzed sample. Further, signals are shown for the lanthanum aluminum oxide substrate underlying the semiconductor matrix. In particular, peak 22 corresponds to the $TiO_2$ material phase and peak 24 corresponds to the $Cu_2O$ material phase.

Accordingly, a device and fabrication process have been described for a hetero-junction device in which conditions are provided such that self-assembled vertically-aligned semiconductor columns of n-type p-type material reside on a substrate. The p-type and n-type pillars in accordance with the invention are particularly advantageous for photovoltaic devices, such as solar cell devices, as these structures maintain a very high interfacial area necessary for effective charge separation and are fabricated with minimal defects. Further, the inventive structure offers shorter electron diffusion path and shorter electron transport time than the layered structures of the prior art. As described above, those skilled in the art will appreciate that further materials can be formed overlying the n-type and p-type materials that are transparent radiation or increase the energy absorption of the matrix material.

Those skilled in the art will appreciate that variations and modifications can be made to provide hetero-junction devices that are specifically designed to absorb particular wavelengths of radiation. Accordingly, a variety of radiation detectors and monitors can be fabricated in accordance with the invention. Accordingly, all such variations and modifications are within the scope of the invention as set forth in the specification and the appended claims.

The invention claimed is:

1. A method of fabricating a hetero-junction device, the method comprising:
    forming a nucleating site on a substrate;
    growing epitaxial pillars of n-type material and p-type material to form adjacent pillars on the nucleating site having a vertically aligned p-n junction therebetween;
    at least partially adjusting the oxidation state of at least one of the n-type material and p-type materials; and
    forming an electrode layer contacting the adjacent pillars.

2. The method of claim 1, wherein growing epitaxial pillars comprises growing semiconductor materials that are substantially insoluble in one another.

3. The method of claim 1, wherein growing epitaxial pillars comprises growing materials having differential energy absorption characteristics.

4. The method of claim 3, wherein growing epitaxial pillars comprises selectively forming a predetermined ratio of p-type material and n-type material to adjust the energy absorption characteristics of the device.

5. The method of claim 3, wherein growing epitaxial pillars comprises growing materials wherein one of the p-type or the n-type material preferentially absorbs visible radiation and the other preferentially absorbs UV radiation.

6. The method of claim 3, wherein growing epitaxial pillars comprises growing semiconductor materials characterized by a band-gap energy, and wherein the band-gap energy is selectively adjusted such that the energy absorption characteristics of the device substantially matches the solar spectrum.

7. The method of claim 3, wherein adjusting the oxidation state of at least one of the n-type material and p-type materials comprises annealing the epitaxial pillars in an oxidizing environment and oxidizing at least one of the n-type or p-type materials to alter the energy absorption characteristics thereof.

8. The method of either claim 6 or 7, wherein growing epitaxial pillars comprises growing copper I oxide p-type material and oxidizing the copper I oxide to copper II oxide.

9. The method of claim 8 further comprising growing n-type titanium dioxide.

10. The method of claim 9, wherein growing epitaxial pillars of n-type material and p-type material comprises growing p-type copper oxide and n-type titanium dioxide.

11. The method of claim 1, wherein adjusting the oxidation state of at least one of the n-type material and p-type materials comprise annealing the epitaxial pillars in an oxidizing environment and oxidizing at least one of the n-type or p-type materials to alter the energy absorption characteristics thereof.

12. The method of claim 1, wherein forming a nucleating site comprises RF magnetron sputtering of substantially the same material as one of the epitaxial pillars of n-type material or p-type material on a crystalline semiconductor surface.

13. The method of claim 12, further comprising forming nucleating sites on a layer of electrically conductive material overlying the substrate.

14. A method of forming a hetero-junction photovoltaic device, the method comprising:
    providing a substrate and forming a nucleating layer on the substrate;
    selectively forming phase-separated, substantially insoluble n-type and p-type pillars on the nucleating layer, the pillars having vertically-aligned radial p-n junctions,
    wherein the n-type and p-type pillars comprise semiconductor materials having band-gap energies to preferentially absorb a designated region of the energy spectrum, such that an energy absorption characteristic of the device is substantially similar to the solar spectrum;
    selectively oxidizing at least a portion of one of the n-type and p-type epitaxial pillars to alter the band-gap energy relative to the other pillar; and
    forming an electrode layer that contacts the n-type and p-type epitaxial pillars.

15. The method of claim 14, wherein forming a nucleating layer comprises depositing a layer of the n-type material or the p-type material onto the substrate.

16. The method of claim 14, wherein co-sputtering an n-type material and a p-type material comprises sputtering from a composite target, the target comprising materials that form chemically phase-separated nucleation sites on the substrate.

17. The method of claim 14 wherein providing a substrate comprises providing an insulating substrate, and wherein the method further comprises forming an electrode layer on the substrate and forming the nucleating layer on the electrically conductive layer.

18. The method of claim 17, wherein forming an electrode layer comprises forming a layer of electrically conductive dielectric material.

19. The method of claim 14, wherein selectively forming pillars comprises forming copper I oxide and wherein selectively oxidizing comprises oxidizing the copper I oxide to copper II oxide.

20. The method of claim 19 wherein selectively oxidizing comprises annealing the substrate after forming the n-type and p-type epitaxial pillars.

21. The method of claim 14, wherein selectively forming phase-separated, substantially insoluble n-type and p-type pillars comprises sputter depositing a $TiO_2$:$Cu_2O$ composite layer.

22. The method of claim 14, wherein providing a substrate comprises providing a $LaAlO_3$ substrate.

23. A photovoltaic device comprising:
    a insulating substrate;
    an electrode layer overlying the substrate;
    phase-separated, substantially insoluble n-type and p-type pillars on the substrate defining vertically-aligned radial p-n junctions,
    wherein the n-type and p-type pillars comprise semiconductor materials having band-gap energies, such that one of the p-type or the n-type pillars preferentially absorbs visible radiation and the other preferentially absorbs UV radiation, and
    wherein an oxidation state of at least a portion of one of the p-type pillars or the n-type pillars are altered relative to the other pillars, such that the band-gap energy differs with respect to a stoichiometric composition; and
    an electrode layer that contacts the n-type and p-type epitaxial pillars.

24. The photovoltaic device of claim 23, wherein the nucleating layer comprises a semiconductor material substantially similar to one of the n-type and p-type pillars.

25. The photovoltaic device of claim 24, wherein the n-type pillar comprises titanium dioxide and the p-type pillar comprises copper I oxide.

26. The photovoltaic device of claim 24, wherein the electrode layer comprises an electrically conductive material.

* * * * *